US007528609B2

(12) United States Patent
Savicki, Jr. et al.

(10) Patent No.: US 7,528,609 B2
(45) Date of Patent: May 5, 2009

(54) ELECTRICAL TESTING DEVICE

(75) Inventors: Gerald R. Savicki, Jr., Canastota, NY (US); Thomas Nelson Packard, Syracuse, NY (US); Dejan Radosavljevic, LaFayette, NY (US)

(73) Assignee: Pass & Seymour, Inc., Syracuse, NY (US)

( * ) Notice: Subject to any disclaimer, the term of this patent is extended or adjusted under 35 U.S.C. 154(b) by 0 days.

(21) Appl. No.: 12/019,326

(22) Filed: Jan. 24, 2008

(65) Prior Publication Data

US 2009/0045817 A1 Feb. 19, 2009

Related U.S. Application Data

(63) Continuation of application No. 11/933,943, filed on Nov. 1, 2007, which is a continuation of application No. 11/691,116, filed on Mar. 26, 2007, which is a continuation of application No. 11/357,563, filed on Feb. 17, 2006, now Pat. No. 7,195,517, which is a continuation of application No. 11/032,420, filed on Jan. 10, 2005, now Pat. No. 7,189,110, which is a continuation-in-part of application No. 10/680,797, filed on Oct. 7, 2003, now Pat. No. 6,994,585.

(51) Int. Cl.
*G01R 31/00* (2006.01)

(52) U.S. Cl. ...................................................... 324/508

(58) Field of Classification Search ................. 324/508, 324/713

See application file for complete search history.

(56) References Cited

U.S. PATENT DOCUMENTS

| | | | |
|---|---|---|---|
| 3,952,244 | A | 4/1976 | Spear |
| 3,967,195 | A | 6/1976 | Averitt et al. |
| 4,015,201 | A | 3/1977 | Chaffee |
| 4,034,284 | A | 7/1977 | Peplow et al. |

(Continued)

*Primary Examiner*—Vincent Q Nguyen
(74) *Attorney, Agent, or Firm*—Daniel P. Malley; Bond, Schoeneck & King, PLLC

(57) ABSTRACT

The present invention is directed to an electrical testing device for use in an AC electrical power distribution circuit including a plurality of AC electric power transmitting wires coupled between an AC power distribution point and a device box. The device includes a plurality of electrical probes configured for insertion into an outlet receptacle. A plug test connection arrangement is configured to receive a plug connector when inserted therein. The plug connector includes a plurality of plug contacts and a termination arrangement configured to terminate the plurality of AC electric power transmitting wires such that electrical continuity is established between the AC power distribution point and the plurality of plug contacts. The plug test connection arrangement includes a plurality of test contacts configured to mate with the plurality of plug contacts when the plug connector is inserted into the plug test connection arrangement. The termination arrangement being in a detached relationship from the device box after the plurality of AC electric power transmitting wires are terminated. An electrical test circuit is configured to perform at least one electrical test. The electrical test circuit includes a switch mechanism configured to connect the electrical test circuit to the plurality of electrical probes at a first switch setting or connect the electrical test circuit to the plurality of test contacts at a second switch setting. At least one shock mitigation structure is coupled to the plurality of electrical probes or the plug test connection arrangement and is configured to prevent user access to the plurality of electrical probes or the plug test connection arrangement.

65 Claims, 11 Drawing Sheets

U.S. PATENT DOCUMENTS

| | | | |
|---|---|---|---|
| 4,082,995 | A | 4/1978 | Rhude |
| 4,105,968 | A | 8/1978 | Mobley et al. |
| 4,118,690 | A | 10/1978 | Paynton |
| 4,127,807 | A | 11/1978 | Peplow et al. |
| 4,152,639 | A | 5/1979 | Chaffee |
| 4,280,092 | A | 7/1981 | Wells, Jr. et al. |
| 5,285,163 | A | 2/1994 | Liotta |
| 5,625,285 | A | 4/1997 | Virgilio |
| 5,642,052 | A | 6/1997 | Earle |
| 6,054,849 | A | 4/2000 | Collier et al. |
| 6,072,317 | A | 6/2000 | Mackenzie |
| 6,218,844 | B1 | 4/2001 | Wong et al. |
| 6,323,652 | B1 | 11/2001 | Collier et al. |
| 6,982,558 | B2 | 1/2006 | Bryndzia et al. |
| 7,057,401 | B2 | 6/2006 | Blades |
| 7,068,038 | B2 | 6/2006 | Mason et al. |
| 7,091,723 | B2 | 8/2006 | Simmons et al. |
| 7,199,587 | B2 | 4/2007 | Hurwicz |
| 7,248,056 | B2 * | 7/2007 | Waldschmidt .............. 324/508 |
| 7,259,567 | B2 | 8/2007 | Sears et al. |
| 7,385,406 | B1 * | 6/2008 | Blades ....................... 324/713 |
| 2006/0103390 | A1 * | 5/2006 | Simmons et al. ............ 324/508 |

* cited by examiner

TRUTH TABLE V

| D1 | D2 | D3 | |
|---|---|---|---|
| X | X | ON | OPEN GROUND |
| X | ON | X | OPEN NEUTRAL |
| X | X | X | OPEN HOT |
| ON | ON | X | HOT/GND. REVERSE |
| ON | X | ON | HOT/NUE. REVERSE |
| X | ON | ON | CORRECT |

ELECTRICAL TESTING DEVICE

CROSS-REFERENCE TO RELATED APPLICATIONS

This is a continuation of U.S. patent application Ser. No. 11/933,943 filed on Nov. 1, 2007, which is a continuation of U.S. patent application Ser. No. 11/691,116 filed on Mar. 26, 2007, which is a continuation of U.S. patent application Ser. No. 11/357,563 filed on Feb. 17, 2006, which is a continuation of U.S. patent application Ser. No. 11/032,420 filed on Jan. 10, 2005, which is a continuation-in-part of U.S. patent application Ser. No. 10/680,797 filed on Oct. 7, 2003, the contents of which is relied upon and incorporated herein by reference in their entirety, and the benefit of priority under 35 U.S.C. §120 is hereby claimed.

BACKGROUND OF THE INVENTION

1. Field of the Invention

The present invention relates generally to electrical systems, and particularly to testing electrical wiring systems.

2. Technical Background

Installing AC electrical distribution circuits in buildings and/or other structures is typically labor intensive, time-consuming, and a process that requires electricians of various skill levels. As a result the installation process is expensive. The first phase of the installation is commonly referred to as the "rough-in" phase. In new construction, conduit, armored cable, or sheathed cable is disposed throughout the structure to form an electrical power distribution circuit originating at a panel. Junction boxes are installed at appropriate locations, and brackets and metal device boxes are installed throughout the structure where electrical service is desired. Junction boxes, of course, are typically employed to house a connection point, or junction, of several conductors. Device boxes are used to accommodate electrical wiring devices. For example, the types of electrical wiring devices may include, but are not limited to, receptacles, switches, dimmers, GFCIs, transient voltage surge suppressors (TVSS), timer devices, sensors of various types, thermostats, lighting fixtures, and/or combinations thereof. Of course, receptacles include at least one outlet receptacle for providing power from the electrical distribution circuit to a user attachable appliance. The appliance receives power from the outlet receptacle by way of a power cord and user attachable plug that inserts into the outlet receptacle. Outlet receptacles may also be included in other types of wiring devices such as those that have been presented.

AC electrical distribution cables may include two to five conductive wires. Many AC electrical distribution circuits may employ three wires, i.e., a line conductor (hot wire), a neutral conductor, and a ground conductor. Some AC electrical distribution circuits may only employ two wires, the line conductor and the neutral conductor. Yet other AC electrical distribution circuits include five wires for transmission of three-phase power. As those of ordinary skill in the art will understand, three phase power includes three "hot" or "live" wires, a neutral conductor and a ground wire. Each of the hot wires transmits electrical power that is 120 degrees out of phase with the other two hot wires. In any event, after the boxes are placed, the electrical wires are pulled through the conduits and all of the circuits are bonded. The leads from the AC electrical distribution wires extend from the boxes and are visible and accessible for the next phase of the installation process.

After the "rough-in" phase has been completed, the electrical wiring devices are terminated, i.e., they are electrically connected to the wire leads. This part of the installation process is the most costly and time consuming. A journeyman electrician must perform, or supervise, the connection of each wiring device in the structure. In this process, each electrical wire must be stripped and terminated to the device.

In another approach that has been considered, after the rough-in phase is completed, a plug connector device is used to terminate the leads of the AC electrical distribution wires extending from each device box in the installation. After the termination is completed, an electrical wiring device is provided that includes a receptacle disposed in the rear portion thereof. The receptacle is configured to receive the plug device, such that electrical continuity is established between the electrical wiring device and the AC electrical distribution wires when the plug device is inserted into the receptacle. When the wiring device is installed in the device box, the receptacle and plug device are not accessible to the user.

What is needed is an AC electrical testing device configured to test an AC electrical distribution circuit that uses either a terminated electrical wiring device or a terminated plug connector device.

SUMMARY OF THE INVENTION

The present invention addresses the needs described above by providing an AC electrical testing device configured to test an AC electrical distribution circuit that uses either a terminated electrical wiring device or a terminated plug connector device.

One aspect of the present invention is directed to an electrical testing device for use in an AC electrical power distribution circuit including a plurality of AC electric power transmitting wires coupled between an AC power distribution point and a device box. The device includes a plurality of electrical probes configured for insertion into an outlet receptacle. A plug test connection arrangement is configured to receive a plug connector when inserted therein. The plug connector includes a plurality of plug contacts and a termination arrangement configured to terminate the plurality of AC electric power transmitting wires such that electrical continuity is established between the AC power distribution point and the plurality of plug contacts. The plug test connection arrangement includes a plurality of test contacts configured to mate with the plurality of plug contacts when the plug connector is inserted into the plug test connection arrangement. The termination arrangement being in a detached relationship from the device box after the plurality of AC electric power transmitting wires are terminated. An electrical test circuit is configured to perform at least one electrical test. The electrical test circuit includes a switch mechanism configured to connect the electrical test circuit to the plurality of electrical probes at a first switch setting or connect the electrical test circuit to the plurality of test contacts at a second switch setting. At least one shock mitigation structure is coupled to the plurality of electrical probes or the plug test connection arrangement and is configured to prevent user access to the plurality of electrical probes or the plug test connection arrangement.

In another aspect, the present invention is directed to an electrical testing device for use in an AC electrical power distribution circuit including a plurality of AC electric power transmitting wires coupled between an AC power distribution point and a device box. The device includes a plug test connection arrangement configured to receive a plug connector when inserted therein. The plug connector includes a plurality of plug contacts and a termination arrangement configured to terminate the plurality of AC electric power transmitting wires such that electrical continuity is established between the AC power distribution point and the plurality of plug contacts. The plug connector is configured to mate within a rear portion of an electrical wiring device via a latching connection to establish electrical continuity between the electrical wiring device and the plurality of AC electric power transmitting wires. The plug test connection arrangement includes a plurality of test contacts configured to mate with the plurality of plug contacts when the plug connector is inserted into the plug test connection arrangement. The termination arrangement is in a detached relationship from the device box after the plurality of AC electric power transmitting wires are terminated. An electrical test circuit is configured to perform at least one electrical test to determine whether the plurality of AC electric power transmitting wires, the plurality of plug contacts or the termination arrangement are correctly interconnected. A display is coupled to the electrical test circuit, the display being configured to generate a user-perceivable signal relating to the at least one electrical test. At least one shock mitigation structure is coupled to the plug test connection arrangement. The at least one shock mitigation structure is configured to prevent user access to the plurality of test contacts when the plug connector is mated with the plug test connection arrangement.

In yet another aspect, the present invention is directed to an electrical testing device for use in an AC electrical power distribution circuit including a plurality of AC electric power transmitting wires coupled between an AC power distribution point and a device box. The device includes a plug test connection arrangement configured to receive at least one plug connector when inserted therein. The at least one plug connector includes a plurality of plug contacts and a termination arrangement configured to terminate the plurality of AC electric power transmitting wires such that electrical continuity is established between the AC power distribution point and the plurality of plug contacts. The plug test connection arrangement includes a plurality of test contacts configured to mate with the plurality of plug contacts when the plug connector is inserted into the plug test connection arrangement. The termination arrangement is in a detached relationship from the device box after the plurality of AC electric power transmitting wires are terminated. An electrical test circuit is configured to perform at least one electrical test to determine whether the plurality of AC electric power transmitting wires, the plurality of plug contacts or the termination arrangement are properly interconnected. The electrical test circuit includes a switch mechanism coupled to a battery. The switch mechanism is configured to couple the battery to the plurality of test contacts and perform the electrical continuity test when the AC electrical power distribution circuit is deenergized. An indicator is coupled to the electrical test circuit. The indicator is configured to generate a user-perceivable signal relating to the electrical continuity test. At least one shock mitigation structure is coupled to the plug test connection arrangement, the at least one shock mitigation structure being configured to prevent user access to the plug test connection arrangement in an energized state.

In yet another aspect, the present invention is directed to an electrical testing device for use in an AC electrical power distribution circuit including a plurality of AC electric power transmitting wires coupled between an AC power distribution point and a device box. The device includes a modular test connection arrangement that has a plurality of replaceable test connectors. The plurality of replaceable test connectors include a replaceable plug test connector arrangement configured to mate with a corresponding plug connector of a plurality of plug connectors. Each plug connector includes a plurality of plug contacts and a termination arrangement configured to terminate the plurality of AC electric power transmitting wires such that electrical continuity is established between the AC power distribution point and the plurality of plug contacts. Each replaceable plug test connector includes a plurality of test contacts configured to mate with the plurality of plug contacts of the corresponding plug connector. The termination arrangement is in a detached relationship from the device box after the plurality of AC electric power transmitting wires are terminated. An electrical test circuit is configured to perform at least one electrical test to determine whether the plurality of AC electric power transmitting wires, the plurality of plug contacts or the termination arrangement are properly interconnected. An indicator is coupled to the electrical test circuit, the indicator being configured to generate a user-perceivable signal relating to the electrical continuity test.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operation of the invention.

DETAILED DESCRIPTION

Figure 1:
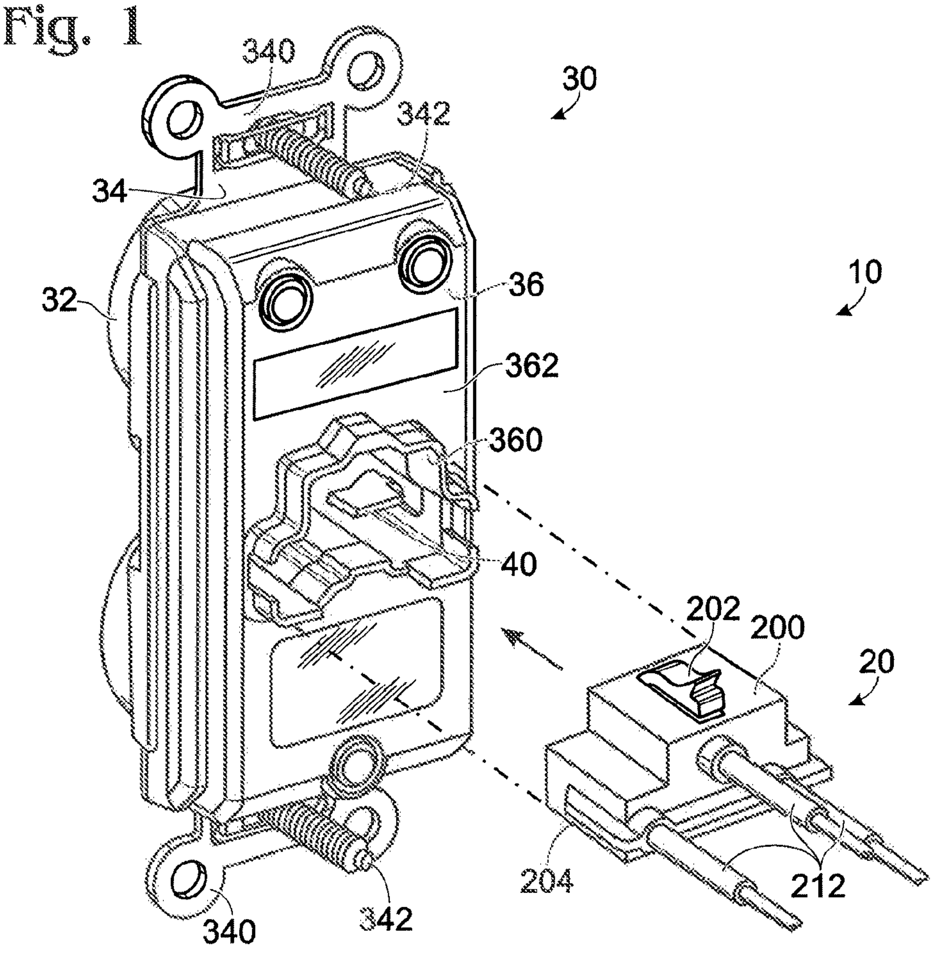
FIG. 1 is a perspective view of an electrical wiring system in accordance with an embodiment of the present invention.

Reference will now be made in detail to the present exemplary embodiments of the invention, examples of which are illustrated in the accompanying drawings. Wherever possible, the same reference numbers will be used throughout the drawings to refer to the same or like parts. An exemplary embodiment of the electrical system of the present invention is shown in FIG. 1, and is designated generally throughout by reference numeral 10.

As embodied herein, and depicted in FIG. 1, a perspective view of an electrical wiring system in accordance with an embodiment of the present invention is disclosed. As noted above, the wiring system 10 includes plug connector 20 and wiring device 30. The plug connector includes a body member 200 that has contacts disposed therein (not shown in this view). Each plug contact is terminated to one of the plurality of AC distribution wires 12 disposed inside the device box after "rough-in" (not shown.). Body 200 includes a latch member 202 configured to hold the plug connector in-place within the body 36 of wiring device 30.

Reference is made to U.S. patent application Ser. No. 10/680,797 (filed on Oct. 7, 2003), which is incorporated herein by reference as though fully set forth in its entirety, for a more detailed explanation of the various termination arrangements that may be employed for terminating AC distribution wires 12 to plug connector 20. For example, the AC wires 12 may be terminated directly within the body 200 of the plug connector. In another example, so-called pig-tailed wires 212 may extend from the plug contacts disposed within body 200. These pig-tail wires may then be terminated to the AC electrical distribution wires 12 by the methods disclosed in the '797 patent application.

The electrical wiring device 30 includes a cover 32, a body 36, and a generally planar ground strap 34 that is disposed between cover 32 and body 36. As shown, the planar ground strap includes a proximal mounting yoke 340 and a distal mounting yoke 340 disposed on opposing ends of ground strap 34. Mounting screws 342 are employed to mount the wiring device to a structure. Referring back to body member 36, a receptacle 360 in formed in the major rear surface 362. A portion of a wiring device contact assembly 40 is accessible via the receptacle 360. Indeed, receptacle 360 is configured to accept the plug connector 20. Wiring device 30 contains a plurality of contact assemblies 40 configured to mate with the plurality of plug contacts (not shown in this view) when the plug connector 20 is inserted into the receptacle 360.

Figure 2:
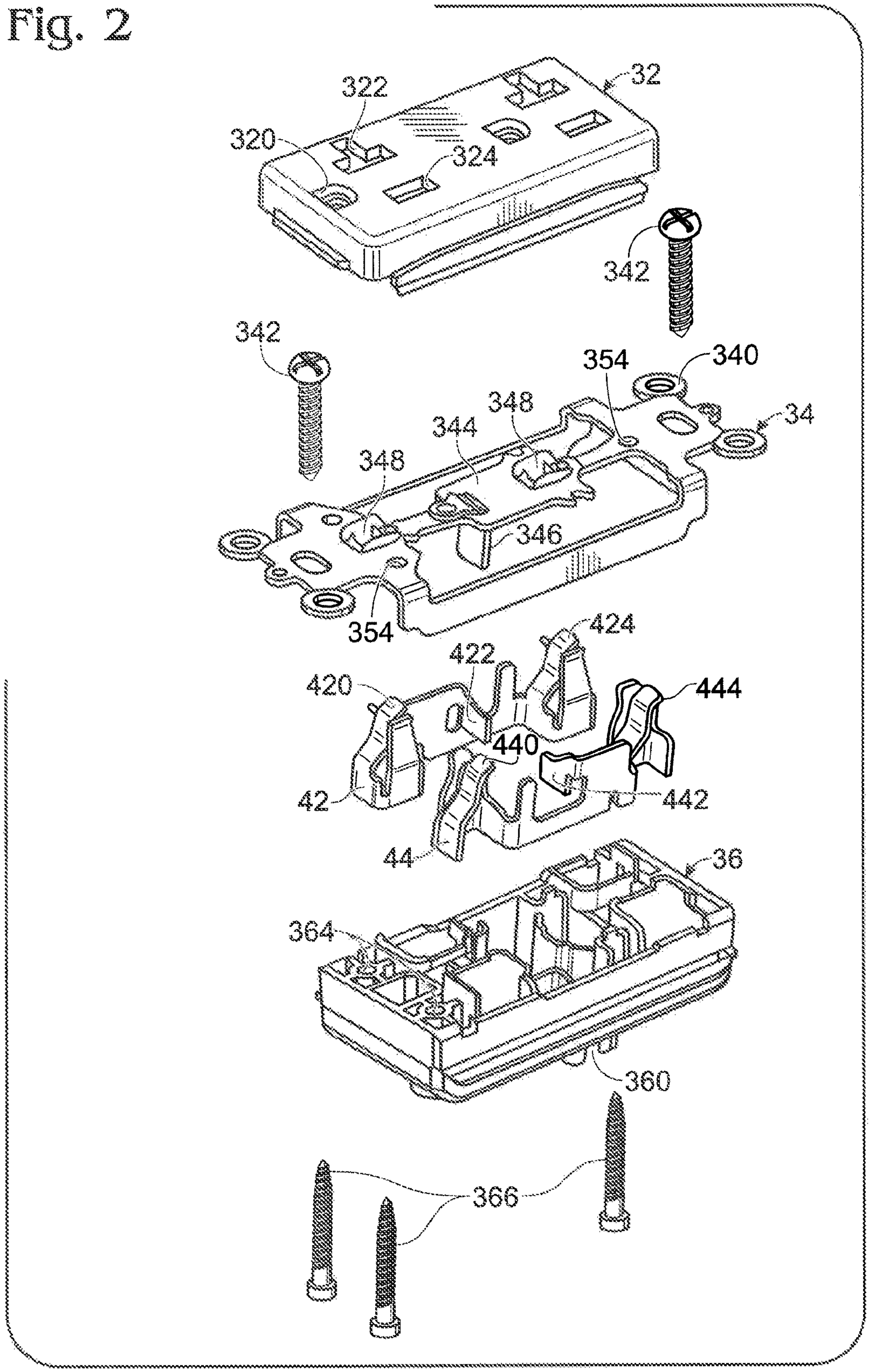
FIG. 2 is an exploded view of an electrical wiring device in accordance with an embodiment of the present invention.

Referring to FIG. 2, an exploded view of a wiring device in accordance with an embodiment of the present invention is disclosed. As shown, ground strap 34 is generally planar in nature and includes an aperture on either side of central portion 344 to accommodate neutral contact assembly 42 and hot contact assembly 44. Neutral contact assembly 42 includes user accessible contacts 420 and 424. Neutral contacts 420, 424 are aligned with user accessible neutral blade receptacle 322 in cover 32. Contact 422 is configured to mate with the plug neutral contacts disposed in plug connector 20. Similarly, hot contacts 440, 444 are aligned with user accessible hot blade receptacle 324 in cover 32. Contact 442 is configured to mate with the plug hot contacts disposed in plug connector 20. Note also that planar ground strap 34 includes a ground blade 346 that is configured to mate with the ground contacts disposed in plug connector 20. Cover 32 also includes ground blade receptacle openings 320. Openings 320 are aligned with ground contacts 348 disposed on ground strap 34. As noted above, the wiring device 10 is joined together by screws 366, which are inserted through holes 364 in the body member 36 and holes 354 disposed in ground strap 34. Cover member 32 includes openings that accommodate screws 366.

Figure 3:
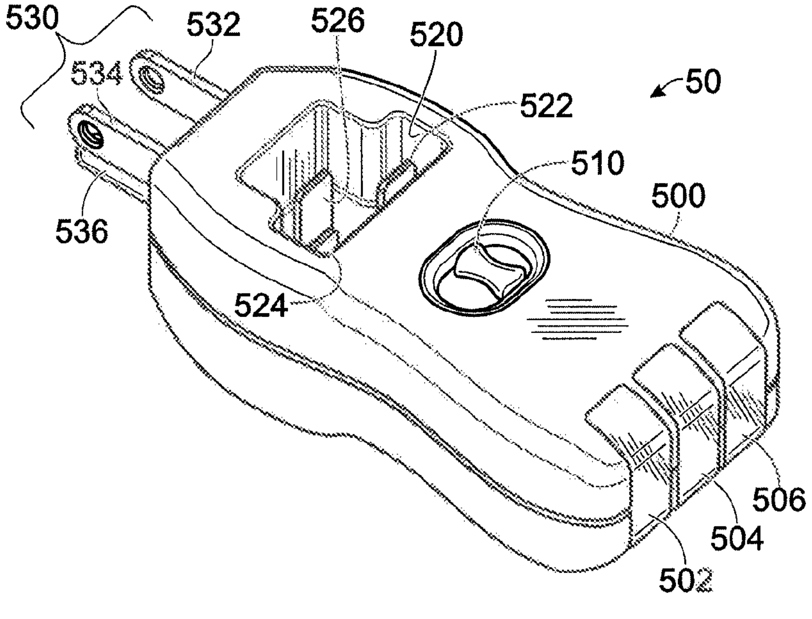
FIG. 3 is a perspective view of an electrical tester in accordance with a first embodiment of the present invention.

As embodied herein and depicted in FIG. 3, a perspective view of an electrical tester 50 in accordance with the first embodiment of the present invention is disclosed. Electrical tester 50, of course, is employed in an AC electrical power distribution circuit and may be used to test the plurality of AC electric power transmitting wires 12, the termination arrangement, the plug connector 20, as well as the electrical wiring device 30 via its outlet receptacle openings (322-324).

The electrical tester 50 includes an electrical test circuit (not shown) disposed in a housing, which comprises housing 500. In this embodiment, electrical probes 530 are disposed at one end of the device 50 and plug tester connection arrangement 520, in this case a receptacle, is disposed at an intermediate portion thereof. A switch actuator 510 is disposed on the body member 500. The switch actuator 510 is coupled to a switch mechanism (not shown). The switch actuator is configured to select a first switch setting and a second switch setting. For example, in the first switch setting, the electrical test circuit is connected to the electrical probes 530. In this setting, the hot blade 532, the neutral blade 534, and the ground prong 536 is inserted into corresponding outlet receptacle openings to thereby perform an electrical test of the outlet receptacle and its corresponding AC distribution circuit. In the second switch setting, the electrical test circuit is connected to the plurality of test contacts (522, 524, 526) disposed in the plug test connection receptacle 520. In this setting, of course, the plug connector 20 is inserted into the plug test connection receptacle 520 for testing of the plug connector, the termination arrangement, and/or the corresponding AC distribution circuit that it is connected to.

The electrical tester 50 also includes a test display coupled to the electrical test circuit. In this embodiment the display is implemented using light indicators (502, 504, 506). The indicators are configured to generate a user-perceivable signal relating to the electrical test being performed.

Referring back to the plug test connection receptacle 520, it is configured to receive plug connector 20 when it is inserted therein. For clarity's sake, the plug connector 20 (shown above in FIG. 1) is equipped with a plurality of plug contacts and a termination arrangement configured to terminate the plurality of AC electric power transmitting wires 12 such that electrical continuity is established between an AC power distribution point and the plurality of plug contacts (disposed within housing 200) after the rough-in phase of the installation is completed. The plug test connection arrangement is meant to emulate the connection arrangement of the electrical wiring device 30 (See FIGS. 1-2), at minimum, the form factor of the plug test connection arrangement 520 must accommodate the plug connector 20. The plug test connection arrangement also includes a plurality of test contacts, i.e., hot test contact 522, neutral test contact 524 and ground test contact 526, that are configured to mate with the plurality of plug contacts when the plug connector 20 is inserted into the plug test connection arrangement 520. The form factor of the plurality of test contacts, therefore, must also accommodate the form factor of plug connector 20 and the plurality of plug connector contacts.

The present invention also includes various shock mitigation structures that are used in conjunction with the electrical probes 530 or the plug test connection arrangement 520. The shock mitigation structures are configured to prevent user access to the plurality of electrical probes or the plug test connection arrangement when there is a potential shock or electrocution hazard present.

In this embodiment, the shock mitigation structure is implemented by the receptacle structure 520 formed within a device body. The receptacle 520 includes the plurality of test contacts (522-526) disposed therein in a recessed manner. Another shock mitigation structure is implemented using a three-way switch having a third switch setting disposed between the first switch setting and the second switch setting. The third switch setting disconnects both the electrical test circuit from both the plurality of test contacts and the plurality of electrical probes. The shock mitigation structure may also be implemented by a shroud or hooded structure disposed around the plurality of test contacts. The shock mitigation structure may also be implemented by a removable cap structure (not shown) that covers the electrical probes 530 when they are not in use.

As will be described in greater in detail below, the electrical test circuit employed herein is configured to perform one or more electrical tests. The electrical test circuit may perform any one of a group of electrical tests that include a continuity test, a polarity test, an over-voltage test, an under-voltage test, and a test configured to determine whether the AC circuit-under-test is protected by a protective wiring device. For example, the electrical test circuit is configured to introduce a simulated ground fault to determine whether the AC circuit-under-test is protected by a GFCI. In another example, the electrical test circuit is configured to introduce a simulated arc fault to determine whether the AC circuit-under-test is protected by an AFCI. The protective device may be disposed in the electrical distribution circuit at a different location in the electrical distribution system compared to the location of the actual test. In yet another embodiment, the electrical test circuit may be configured to selectively provide the display with uniquely coded user-perceivable signals at a given time. Each coded signal represents a corresponding one of a plurality of improper wiring conditions in the plurality of AC electric power transmitting wires, the plurality of plug contacts or the termination arrangement.

Figure 4:
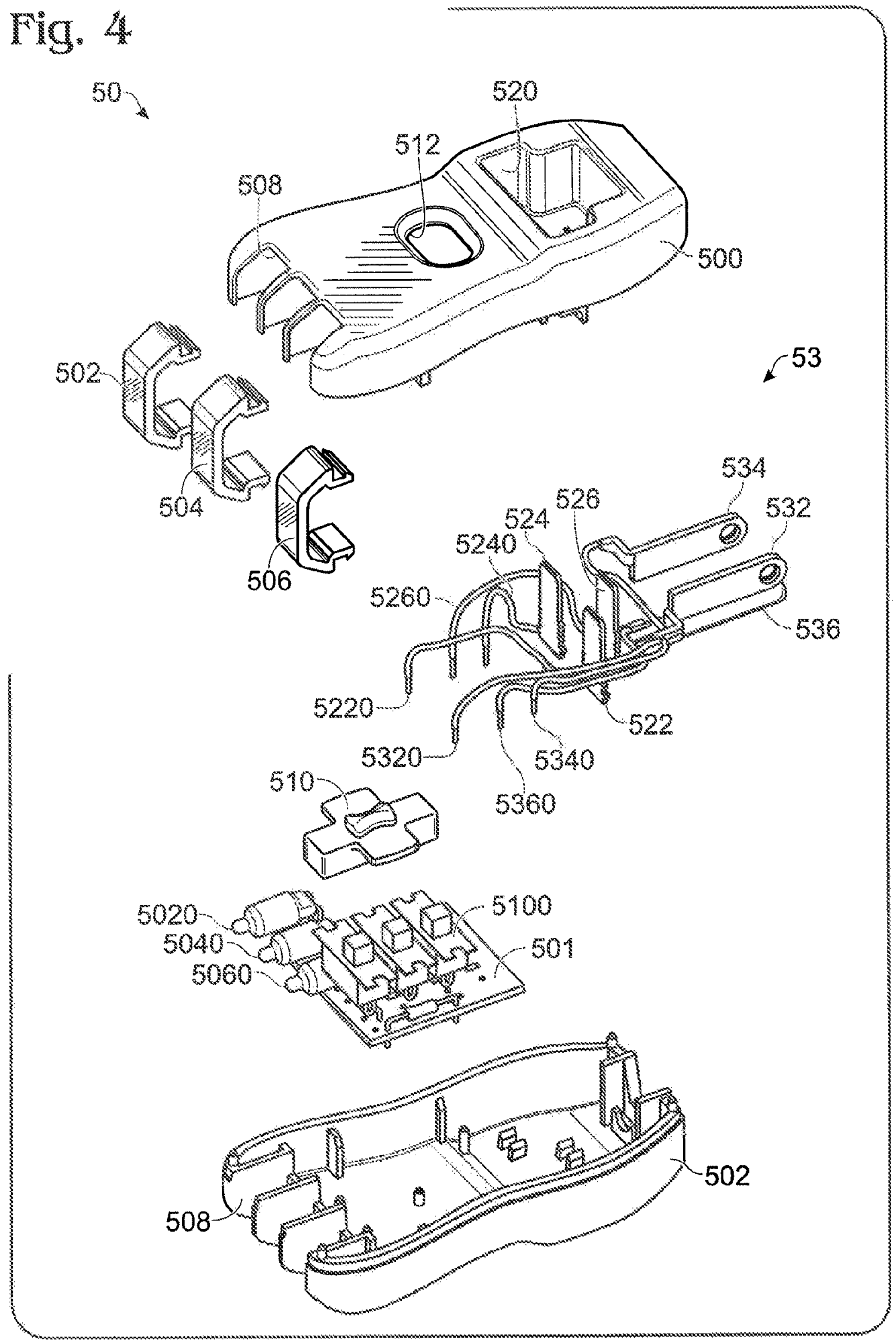
FIG. 4 is an exploded view of the electrical tester depicted in FIG. 3.

Referring to FIG. 4, an exploded view of the electrical tester 50 depicted in FIG. 3 is shown. Tester 50 includes a housing 500 that is formed, in accordance with one embodiment of the present invention by an injection molding process that produces plug test connection receptacle 520, slots 508 for lenses 502, 504 and 506, and aperture 512 for switch actuator 510. Tester 50 includes an interconnection structure 53. The interconnection structure 53 includes the electrical probe contacts 532, 534 and 536 coupled to wires 5320, 5340 and 5360, respectively. These wires, of course, are coupled to switch mechanism 5100. The interconnection mechanism 53 also includes the plurality of test contacts 522, 524, and 526, which are coupled to wires 5220, 5240, and 5260, respectively. During operation, of course, the switch actuator 510 actuates switch mechanism 5100 such that the electrical circuit disposed on printed circuit board (PCB) 501 is coupled to either wires 5320, 5340 and 5360 (and thus to electrical probes 530), or wires 5220, 5240, and 5260 (and thus to test contacts 522-526).

The PCB 501 also includes lamp elements 5020, 5040, and 5060 which are covered by indicator lenses 502, 504, and 506, respectively. The lamp elements 5020, 5040, and 5060 may be implemented as neon light bulbs. In another embodiment, the lamp elements may be implemented using colored LEDs. As will be described below, these individual indicators may be replaced by a single two (2)-dimensional display, e.g., an LCD display or equivalent. Of course, the PCB and lamp elements are disposed in slots 508 formed in housing 500.

Figure 5A:
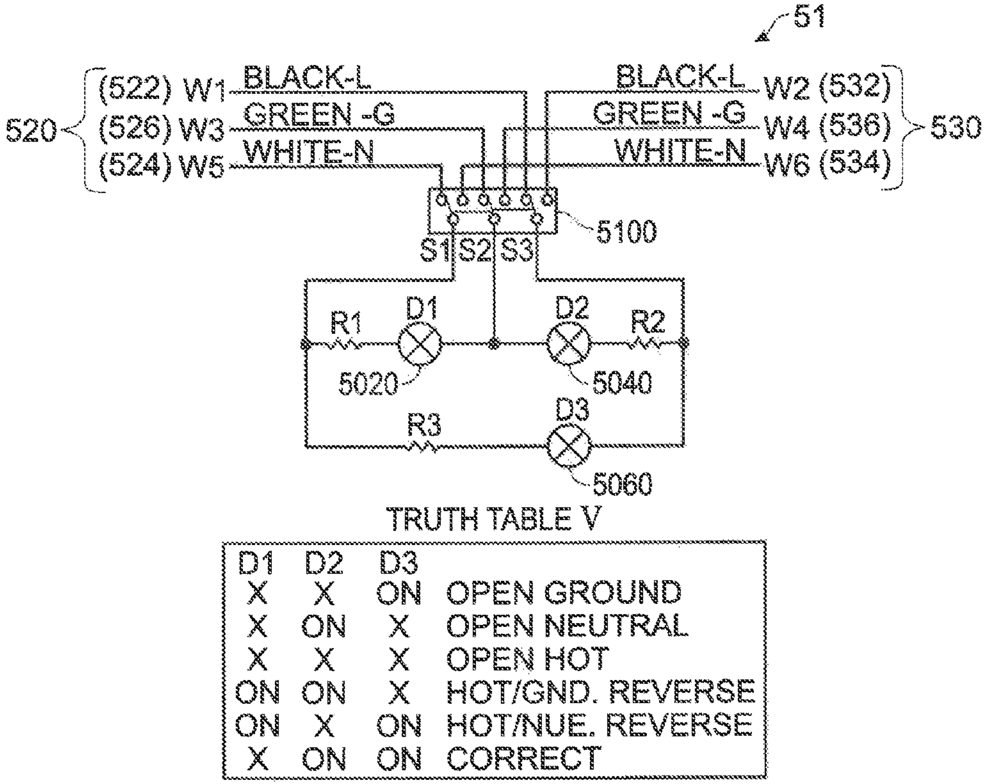
FIGS. 5A-5C are schematic diagrams of the electrical tester in accordance with various embodiments of the present invention.
Figure 5B:
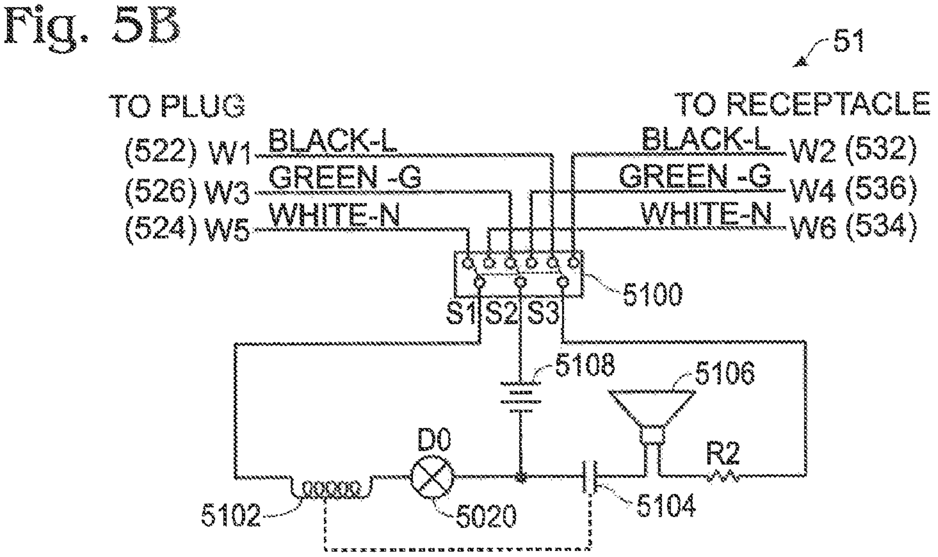
Figure 5C:
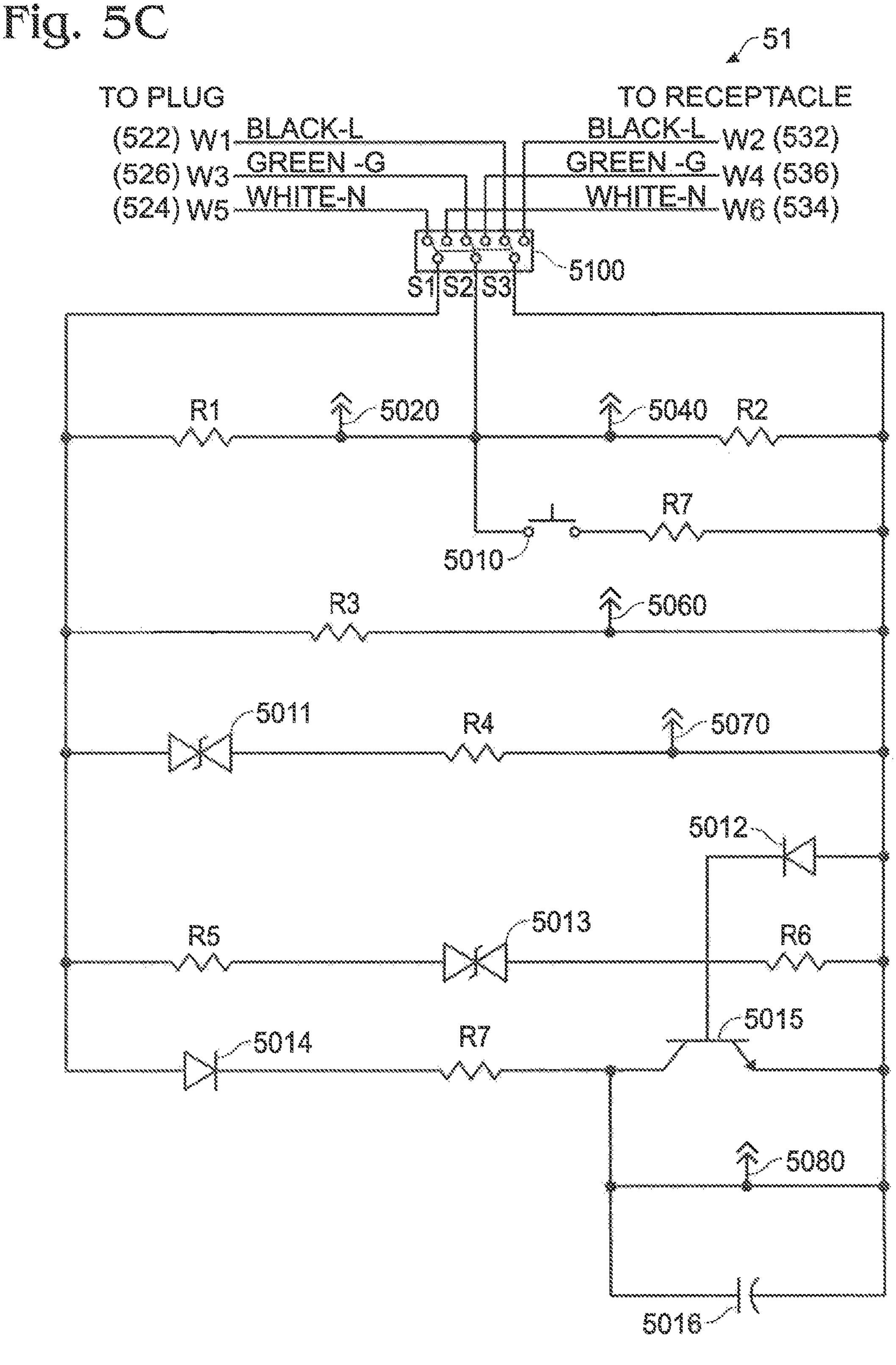

FIGS. 5A-5C are schematic diagrams of the electrical tester in accordance with various embodiments of the present invention.

As embodied herein and depicted in FIG. 5A, a schematic diagram of the electrical tester shown in FIG. 3 in accordance with one embodiment of the present invention is disclosed. In the embodiment shown, the switch mechanism 5100 may be configured as a two-way switch that includes a position to test a plug connector by way of the plug test connection arrangement 520. In the other setting, the tester 50 is configured to test an outlet receptacle via the plurality of electrical probes 530.

The electrical circuit 51 is configured to determine whether the AC electric power transmitting wires, the plurality of plug contacts or the termination arrangement are correctly interconnected. Accordingly, the "Truth Table V" shown to the left of the circuit 51 in FIG. 5A shows the values of the discrete lamp indicators 5020, 5040, and 5060 for various conditions in the AC electrical distribution circuit. In reference to the first line in Truth Table V, the AC electric ground wire, the plug ground contact and the ground termination arrangement are electrically continuous when the ground portion of the AC electric distribution circuit is properly interconnected. However, when an OPEN GROUND condition exists, there is some point in the AC electric ground wire, the plug ground contact or the ground termination arrangement that is open circuited. Little or no current can flow, therefore, through lamp 5020 or 5020 because of the aforementioned discontinuity. Current does flow, however, through indicator 5060 because of the current path established via contact 522 (532), switch contact S3, lamp 5060, R3, switch contact S1, and neutral contact 524 (534). Thus, the truth table includes an "x" to denote the deenergized state of lamps 5020 and 5040, and an "ON" for lamp 5060. Thus, if there is an OPEN GROUND condition, only indicator lamp 5060 will be energized. A similar analysis may be performed for each of the subsequent lines in Truth Table V.

Referring to FIG. 5B, an alternate embodiment of the electrical circuit 51 is disclosed. In this embodiment, electrical tester 50 is configured to perform the various tests in the AC electric power transmitting wires, the plurality of plug contacts or the termination arrangement without requiring that line voltage is available from the AC distribution circuit. Thus, the testing of the wiring at the device box under test may be performed with the upstream breaker in the open position or with the panel box itself in a deenergized state.

In the alternate embodiment, the tester 50 includes lamp 5020 and an annunciator 5106 in place of lamp 5040. The third lamp of the previous embodiment is omitted. Lamp 5020 is placed in series with relay 5102 and connected to the neutral switch contact S1. A battery 5108 is connected to the ground ("green") switch contacts S2. The annunciator 5106 is connected in series with contact 5104 and resistor R2, and coupled to switch contact S3. The contact 5104 is normally open and controlled by the operation of solenoid coil 5102.

If there is continuity between white and green at the panel, Indicator lamp 5020 (D1) is energized to indicate that the white and green are wired properly. If lamp 5020 (D1) is energized it also indicates that it is most likely that neither the hot (black) and ground (green) wires have not been transposed, nor the hot (black) and neutral (white wires). In any event, when lamp 5020 is energized, current is also flowing through relay solenoid 5102 to thereby close contact 5104. Contact 5104 is open when the neutral (white) and ground (green) wires are improperly wired. The annunciator 5106 is prevented from generating a signal until the wiring error is corrected. If lamp 5020 is not illuminated, the electrician is led to correct the wiring error before proceeding to the next step.

The tester 50 remains installed at the device box for the next step in the test procedure, which involves testing the hot (black) conductor. A jumper is introduced across the load terminals of the corresponding breaker in order to establish continuity between green and black to verify that the black conductor is continuous to the panel. If there is continuity in the black circuit, the annunciator starts producing an audible signal. If not, the wrong breaker in the panel may have been "jumpered" or there is not electrical continuity in the black conductor from the device box to the panel.

In yet another alternate embodiment of the present invention, switch 5100 is implemented as a three pole, four position switch to combine the circuit of FIG. 5A and the circuit of FIG. 5B. The various position of the four position switch allow the tester to test a plug connector or receptacle outlet when either the AC line voltage is available or not available. In other words, when the line voltage is not present the switch position is selected such that the battery is employed. If the line voltage is available, another switch position is employed.

Referring to FIG. 5C, another alternate embodiment of the electrical test circuit 51 is disclosed. In this embodiment, the lamps 5020, 5040, and 5060 have been replaced by five (5) "display output elements" 5020, 5040, 5060, 5070, and 5080. Depending on the implementation, the display output elements 5020, 5040, 5060, 5070, and 5080 may be implemented as neon lamp bulbs, LEDs, annunciators, or as inputs to a small microprocessor. In the latter embodiment, the lamp is replaced by microprocessor input wherein the voltage or the current value at each location 5020, 5040, 5060, 5070, and 5080 is sampled at predetermined sampling intervals. A "truth table" is stored in memory that reflects the possible value combinations. The microprocessor may be programmed to provide test results via any suitable display, such as the discrete lamp indicators previously disclosed, or by way of a two-dimensional that provides alphanumeric test result messages.

The circuit depicted in FIG. 5C is based on the circuit shown in FIG. 5A. Display outputs 5020, 5040, and 5060 are analogous to the identically numbered lamps shown in Figure A. Two additional output displays 5070 and 5080 have been added. One skilled in the art will note that user-accessible switch 5010 in series with resistor R7 are disposed in parallel with display output 5040. When the switch 5010 is closed, a current flows from hot to ground through the resistor. The purpose of this added circuit is to generate a simulated test signal configured to trip an upstream AFCI or GFCI breaker or receptacle. This verifies that the device box position is downstream of an intended protective device and is thus being protected. This circuit may also be used to remove power from the outlet position by tripping the upstream GFCI (AFCI) if so desired.

FIG. 5C further comprises an over-voltage detection circuit. The over-voltage detection circuit is implemented using zener diode 5011 in series with resistor R4 and display output 5070. The "back-to-back" zener device 5011 does not conduct current if the peak supply voltage is below a predetermined threshold. In a discrete indicator embodiment, the lamp 5070 is energized to indicate that the predetermined voltage threshold has been exceeded. In the microprocessor embodiment, the processor monitors the current at sample point 5070 to determine whether an over-voltage condition is extant.

FIG. 5C also includes an under-voltage detection circuit. The under-voltage detection circuit is implemented using "back-to-back" zener device 5013 to control the input of transistor 5015. The transistor 5015 controls display output 5080. If the peak supply voltage is greater than a predetermined threshold, zener device 5015 is configured to conduct current. When the peak voltage exceeds this predetermined threshold voltage, the transistor 5015 prevents lamp 5080 from being energized. When the voltage is less than the predetermined threshold, the lamp 5080 turns on, representing an under-voltage condition. Again, lamp 5080 may replaced by microprocessor input.

Figure 6:
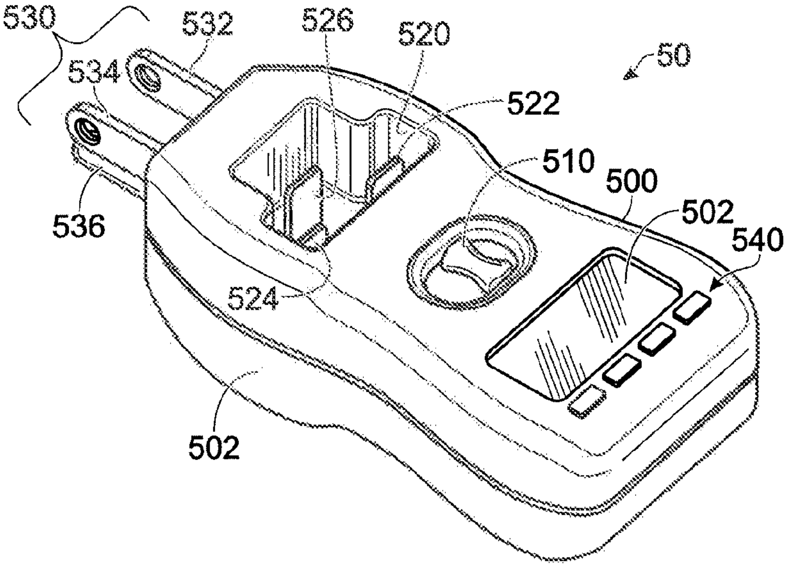
FIG. 6 is a perspective view of an electrical tester in accordance with a second embodiment of the present invention.

As embodied herein and depicted in FIG. 6, a perspective view of an electrical tester 50 in accordance with the second embodiment of the present invention is disclosed. The electrical tester differs from the embodiment of FIG. 3 in that indicators 502, 504, and 506 are replaced by a single two-dimensional display 502. Display 502 may be operated by I/O buttons 540. The I/O buttons may also include a user-accessible switch (e.g., 5010 shown in FIG. 5C. Of course, the embodiment of FIG. 3 may also be configured with a user-accessible switch. The electrical test probes 530 and the plug connector test arrangement 520 of FIG. 6 are identical to those depicted in FIG. 3.

Figure 7A:
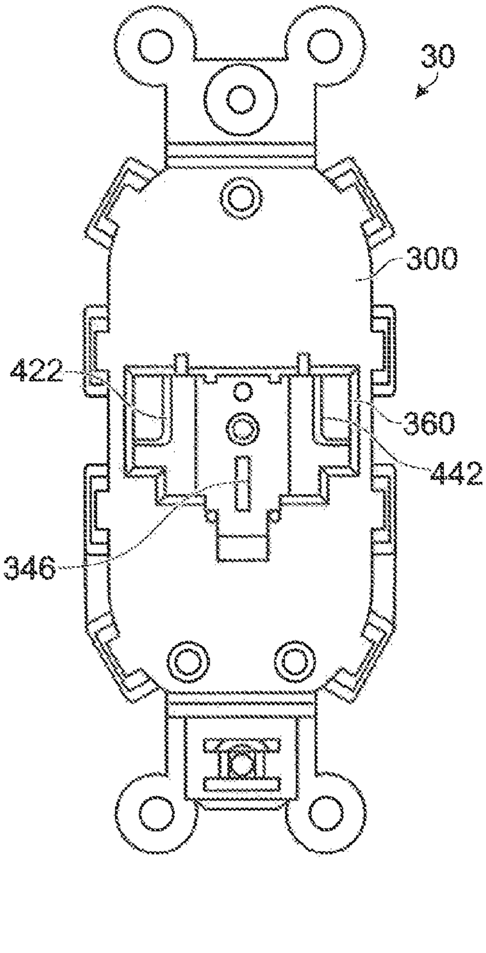
FIG. 7A is a rear plan view of an electrical wiring device in accordance with an embodiment of the present invention.

Referring to FIG. 7A, a rear plan view of an electrical wiring device 30 in accordance with an embodiment of the present invention is depicted. In other words, the present invention may be configured to test a plug connector that matches the form factor of receptacle 360 and the contacts 346, 422, and 442 disposed therein.

Figure 7B:
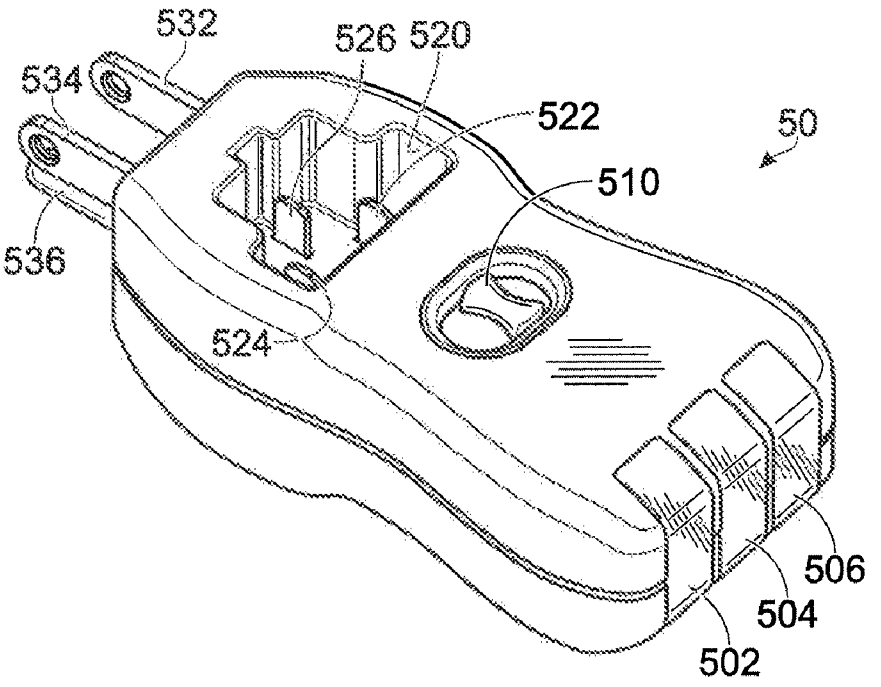
FIG. 7B is a perspective view of an electrical tester in accordance with a third embodiment of the present invention.

Referring to FIG. 7B, a perspective view of an electrical tester 50 in accordance with the third embodiment of the present invention is shown. The plug connector test arrangement 520 of the plug tester 50 shown in FIG. 7B does, in fact, match the form factor of receptacle 360 and the contacts (346, 422, and 442) of the electrical wiring device shown in FIG. 7A. Other than the form factor of the plug connector test arrangement 520, the plug tester depicted in FIG. 7B is identical to the one shown in FIG. 3.

Figure 8A:
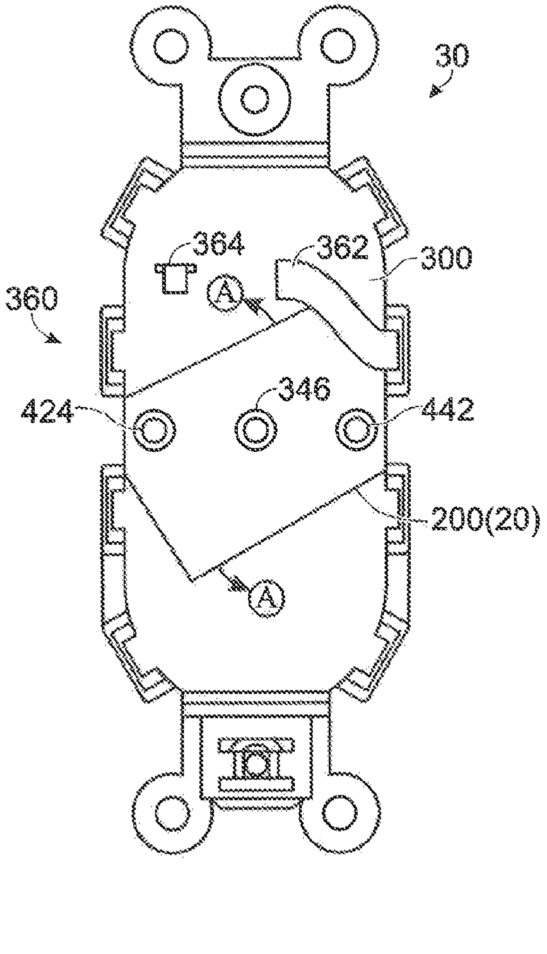
FIG. 8A is a rear plan view of an electrical wiring device in accordance with an embodiment of the present invention.

As embodied herein and depicted in FIG. 8A, a rear plan view of an electrical wiring device 30 in accordance with another embodiment of the present invention is shown. The connection arrangement 360 is formed within a region 200 of a rear major surface of the electrical testing device 30 as shown. Region 200, in fact, substantially corresponds to the foot print of the plug connector that is configured to mate with connection arrangement 360. The connection arrangement 360 includes a retaining wall 362 that extends upwardly from the rear major surface of the electrical wiring device 30 and substantially conforms to the footprint of connector 20. The plurality of contacts (346, 422, 442) are implemented as conductive posts structures disposed within the region 200. In operation, the plug connector is positioned such that the plurality of plug contacts are mated with conductive post contacts 424, 346 and 442, respectively. Subsequently, the plug connector 20 is rotated in the direction "A" and retained by latch structure 364.

Figure 8B:
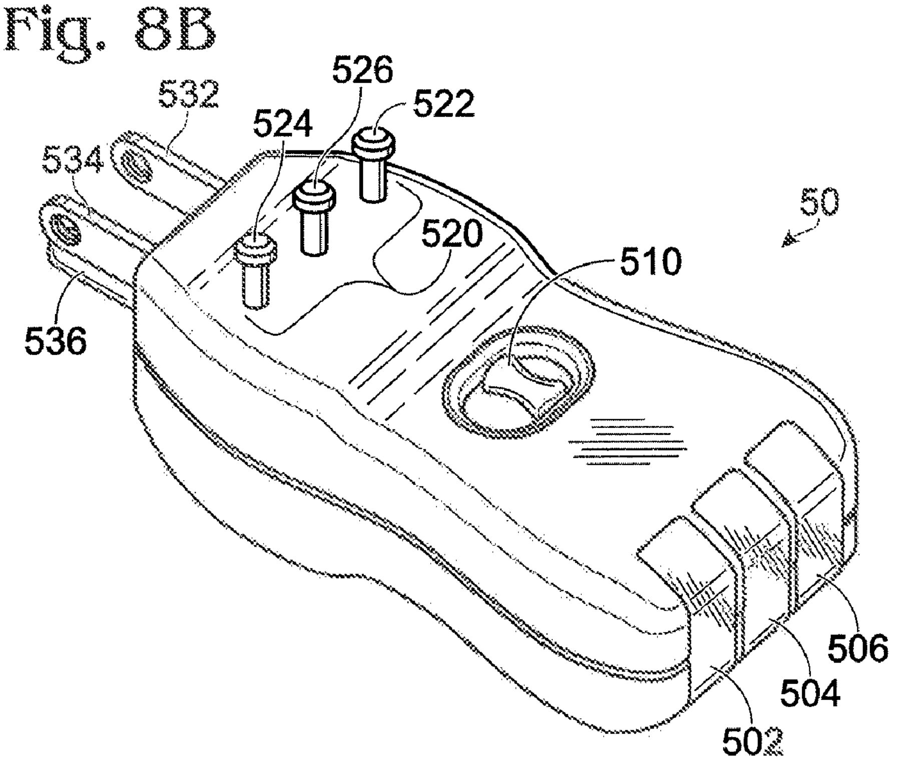
FIG. 8B is a perspective view of an electrical tester in accordance with a fourth embodiment of the present invention.
Figure 8C:
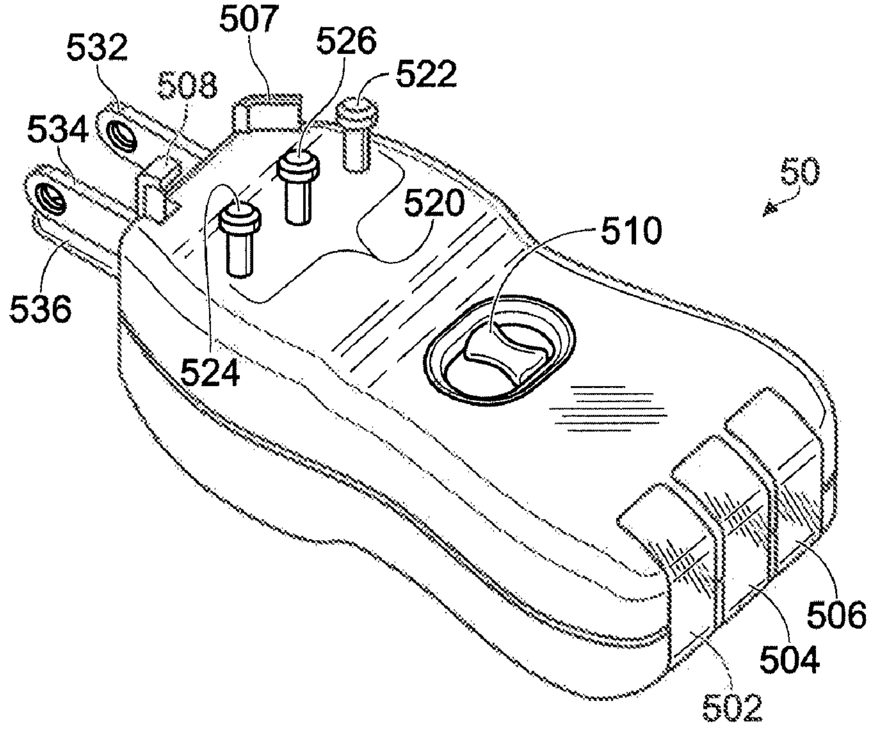
FIG. 8C is a perspective view of an alternate electrical tester in accordance with the fourth embodiment of the present invention.

FIG. 8B is a perspective view of an electrical tester 50 that includes a plug test connection arrangement that emulates the connection arrangement 360 of the wiring device shown in FIG. 8A. Accordingly, plug test contacts 522, 524 and 526 are implemented as conductive posts structures that dimensionally conform to the plurality of contacts (346, 422, 442), and hence, the footprint of connector 20. FIG. 8C is a perspective view of an alternate electrical tester in accordance with the fourth embodiment of the present invention. The plug test connection arrangement 520 of is embodiment includes a retaining wall 507 and a latch structure 508 like that shown in FIG. 8A. The plug connector 20 is positioned onto the plug test connection arrangement 520 such that the plurality of plug contacts are mated with the plurality of test contacts (522, 524, 526). Subsequently, the plug connector 20 is rotated within retaining wall 507 and retained by latch structure 508. Latch structure 508 is configured to be releasable to permit plug connector 20 to be separated from electrical tester 70 after the testing has been completed.

Figure 9:
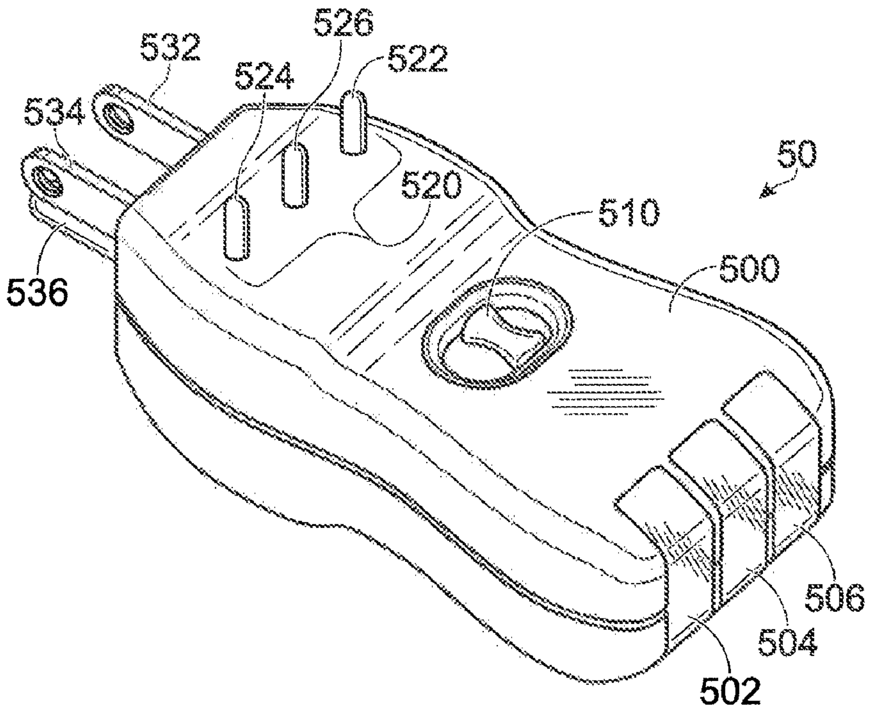
FIG. 9 is a perspective view of an electrical tester in accordance with a fifth embodiment of the present invention.

Referring to FIG. 9, a perspective view of an electrical tester in accordance with a fifth embodiment of the present invention is shown. The only difference between electrical tester 50 and the one shown in FIG. 8B is the shape of the plurality of test contacts (522-526). The conductive posts are replaced by conductive pin structures.

Figure 10:
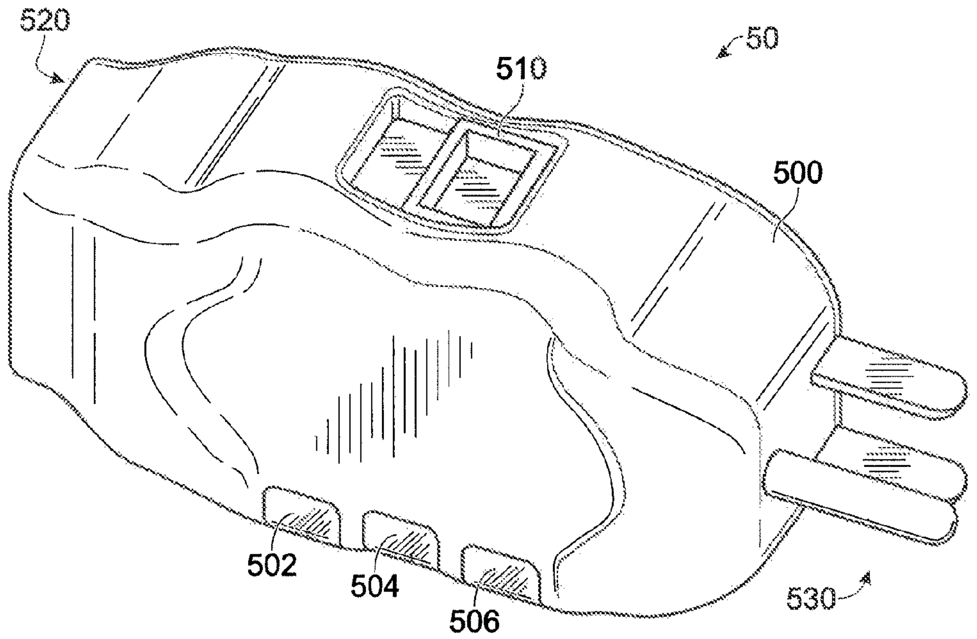
FIG. 10 is a perspective view of an electrical tester in accordance with a sixth embodiment of the present invention.

As embodied herein and depicted in FIG. 10, a perspective view of an electrical tester in accordance with a sixth embodiment of the present invention is shown. The electrical probes 530 of electrical tester 50 are exposed at one end of the device housing 500 and the plurality of test contacts are disposed at the other end. The plurality of test contacts are recessed within the plug connection test receptacle 520 (not shown). When the switch actuator 510 is moved to the right, the electrical probes 530 are exposed and the test contacts are recessed within housing 500. The switch mechanism 510 and the plurality of indicators (502, 504, 506) are disposed at an intermediate portion of housing 500.

Figure 11A:
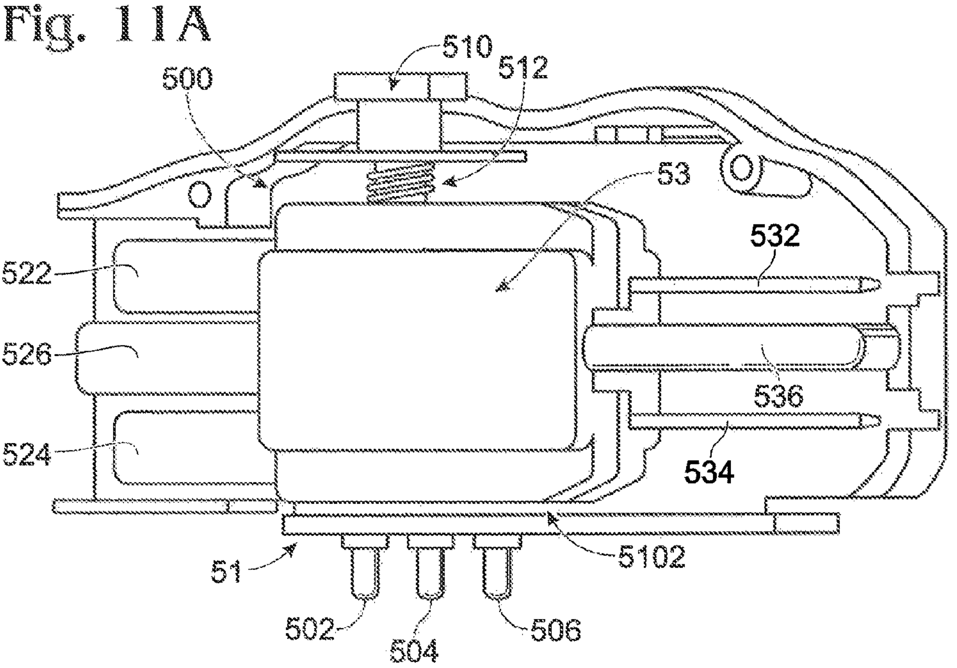
FIG. 11A is a side cross-sectional view of the electrical tester shown in FIG. 10 in a first operational mode.

FIG. 11A is a side cross-sectional view of the electrical tester shown in FIG. 10 in a first switch setting. Tester 50 includes a retractable slide mechanism 53 disposed in the housing 500. Slide mechanism 53 is, of course, analogous to the interconnection structure 53 shown in FIG. 4. The retractable slide mechanism 53 includes the plurality of electrical probes (532, 534, 536) disposed at a first end thereof and the plurality of test contacts (522, 524, 526) disposed at a second end thereof. Test contacts (522, 524, 526) are connected electrically to the corresponding electrical probes (532, 534, and 536). In the switch setting shown in FIG. 11A, the plurality of test contacts (522, 524, 526) are accessible via one end of the device 50, while the plurality of electrical probes (532, 534, 536) are recessed within the other end of the device 50 and not accessible. Note that the plug connector 20 is inserted into the first end to thereby mate with the plurality of test contacts (522, 524, 526). The retractable slide mechanism 53 includes circuit contactors 5102 which mate with slide contacts 5104 (not shown in this view) disposed on printed circuit board (PCB) 51. The indicators (502-506) are connected to the underside of the PCB 51 and viewable via the underside of housing 500.

Figure 11B:
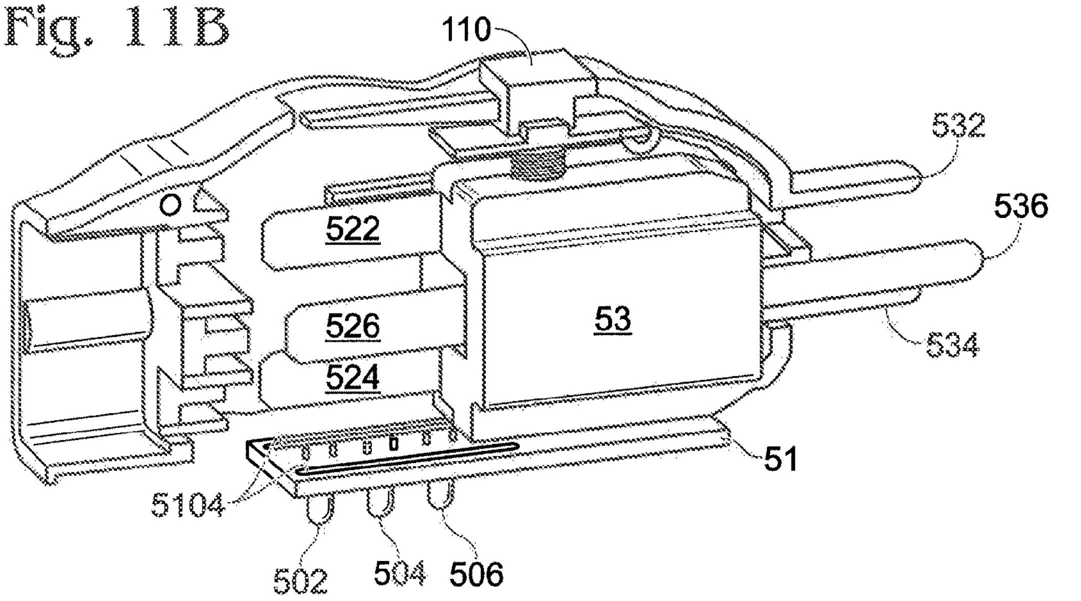
FIG. 11B is a side cross-sectional view of the electrical tester shown in FIG. 10 in a second operational mode.

FIG. 11B is a side cross-sectional view of the electrical tester 50 shown in the second operational mode or switch setting. In the second switch setting, the plurality of electrical probes are exposed and accessible at the second end of tester 50 while the plurality of test contacts are deeply recessed within the first end. The switch actuator 510 is configured to move the retractable slide mechanism 53 between the two switch settings. Thus switch actuator 510 serves as a shock mitigation feature by shrouding either the plurality of electrical probes or the plurality of electrical contacts, whichever plurality is not in use.

In an alternate embodiment, the retractable slide mechanism 53 may be disposed in a third intermediate switch setting such that the electrical probes and the test contacts become mechanically protected when not in use.

Figure 12A:
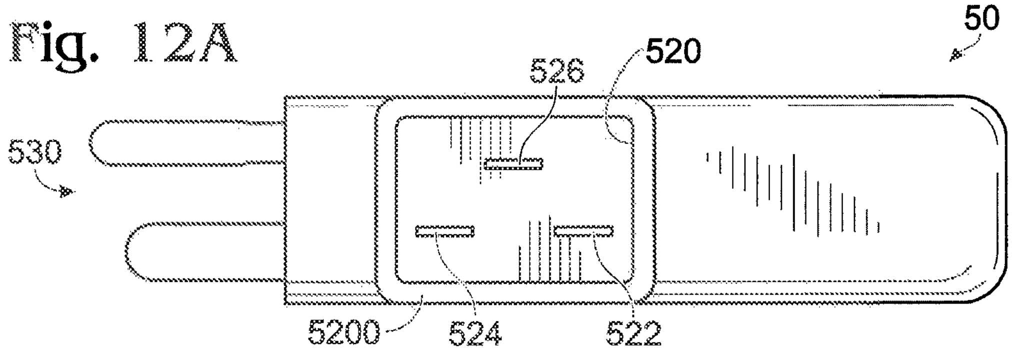
FIGS. 12A-12D are perspective views of an electrical tester in accordance with a seventh embodiment of the present invention.
Figure 12B:
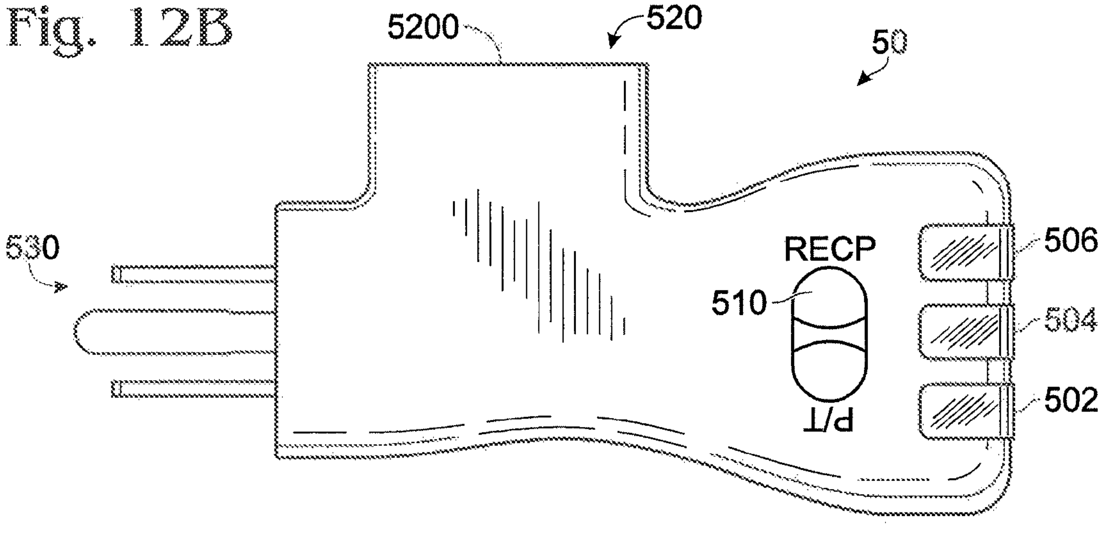
Figure 12C:
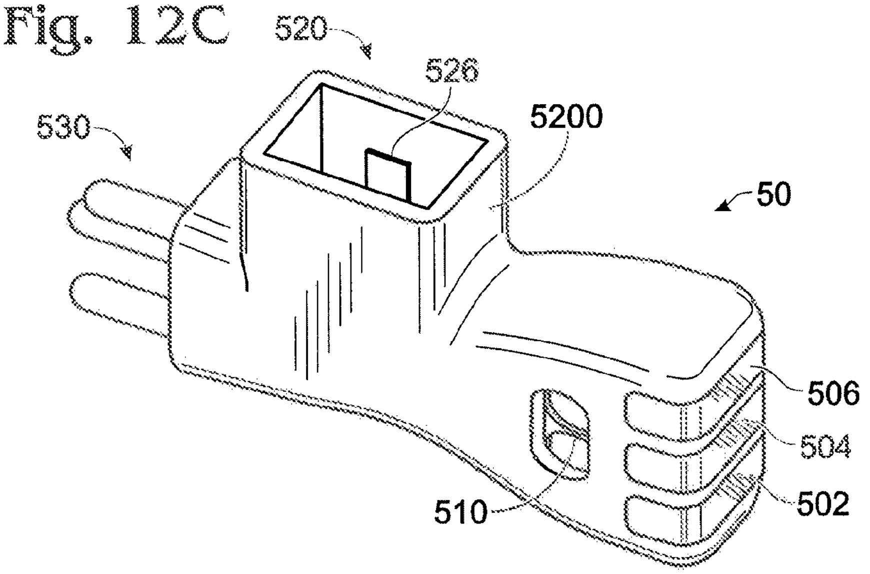
Figure 12D:
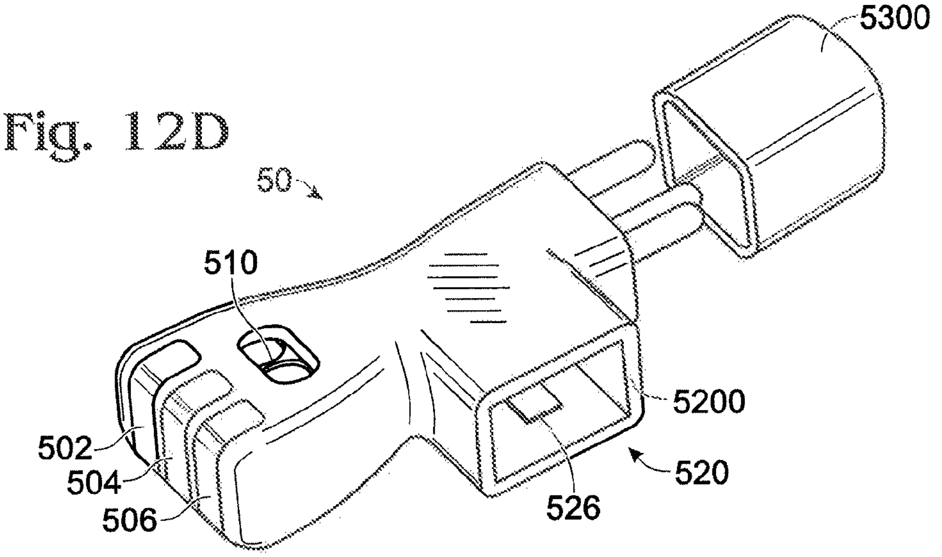

As embodied herein and depicted in FIGS. 12A-12D, perspective views of an electrical tester in accordance with the seventh embodiment of the present invention are disclosed. In this embodiment, the plurality of test contacts (522, 524, 526) and the plurality of electrical probes (532, 534, 536) are disposed at one end of the device 50 while the switch actuator 510 and the indicators (5020-5060) are disposed in a handle shaped portion of housing 500. The plug connector test arrangement 520 includes a hooded shroud around the plurality of test contacts (522, 524, 526) as a shock mitigation feature. Referring to FIG. 12D, a cap structure 5300 may be disposed over the plurality of electrical probes (532, 534, 536) when they are not in use. Of course, the cap structure 5300 may be employed in any of the other previously disclosed embodiments where appropriate.

Figure 13:
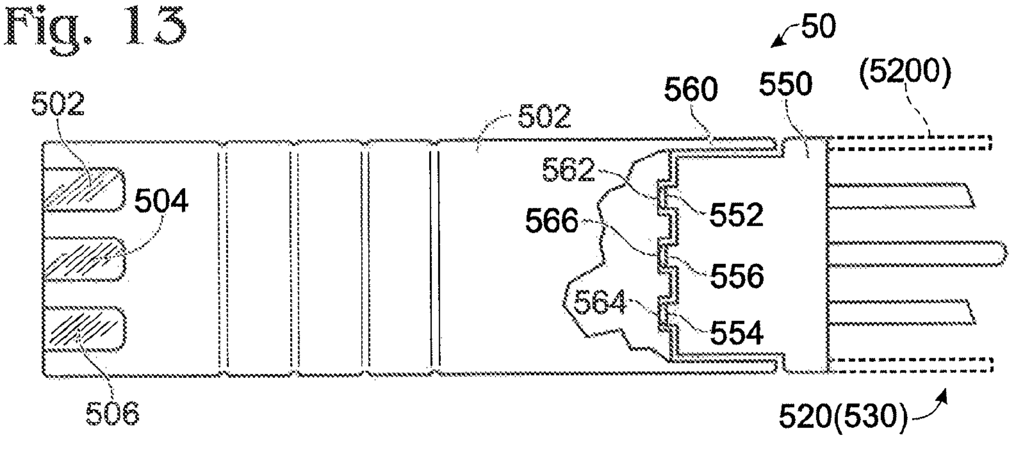
FIG. 13 is a partial cross-sectional view of a modular electrical tester in accordance with an eighth embodiment of the present invention.

As embodied herein and depicted in FIG. 13, a partial cross-sectional view of a modular electrical tester 50 in accordance with the eighth embodiment of the present invention is disclosed. In this embodiment, the indicators are disposed at end of the housing 500 and a modular test connection arrangement disposed at the other end thereof. The modular test connection arrangement includes an interchangeable and replaceable contact module 550 disposed in a socket 560. The socket 560 includes socket contacts 562, 564, and 566 that mate with module contacts 552, 554, and 556, respectively. The replaceable contact module 550 may be configured in accordance with any one of the plurality of test contacts disclosed herein. In other words, this embodiment contemplates a plurality of plug tester contact modules 550. Each replaceable tester module 550 is configured to mate with a corresponding plug connector. Thus, each replaceable plug tester contact modules 550 includes a plurality of test contacts (522, 524, 526) that are configured to mate with the plurality of plug contacts of the corresponding plug connector. As shown, the replaceable contact module 550 may include a hooded shroud 5200 such that the replaceable contact module 550 is configured as a receptacle structure.

In another embodiment, the replaceable contact module 550 has a form factor similar to that shown in FIGS. 8A-8D. In other words, the plug connector test arrangement 520 is disposed on an end surface of the replaceable contact module 550. A retaining wall and a latch mechanism may also be disposed around a perimeter portion of the replaceable plug test connector arrangement 520. In this embodiment, the plurality of test contacts are implemented as a plurality of conductive posts structures extending from the major surface.

The replaceable contact module 550 may also be configured to include a plurality of electrical probes configured for insertion into an outlet receptacle. As such, the plurality of electrical probes may be configured to include a hot blade structure, a neutral blade structure and a ground prong. Of course, the ground prong may be omitted.

All references, including publications, patent applications, and patents, cited herein are hereby incorporated by reference to the same extent as if each reference were individually and specifically indicated to be incorporated by reference and were set forth in its entirety herein.

The use of the terms “a” and “an” and “the” and similar referents in the context of describing the invention (especially in the context of the following claims) are to be construed to cover both the singular and the plural, unless otherwise indicated herein or clearly contradicted by context. The terms “comprising,” “having,” “including,” and “containing” are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

What is claimed is:

1. An electrical testing device for use in an AC electrical power distribution circuit including a plurality of AC electric power transmitting wires coupled between an AC power distribution point and a device box, the device comprising:

a plurality of electrical probes configured for insertion into an outlet receptacle;

a plug test connection arrangement configured to receive a plug connector when inserted therein, the plug connector including a plurality of plug contacts and a termination arrangement configured to terminate the plurality of AC electric power transmitting wires such that electrical continuity is established between the AC power distribution point and the plurality of plug contacts, the plug test connection arrangement including a plurality of test contacts configured to mate with the plurality of plug contacts when the plug connector is inserted into the plug test connection arrangement, the termination arrangement being in a detached relationship from the device box after the plurality of AC electric power transmitting wires are terminated;

an electrical test circuit configured to perform at least one electrical test, the electrical test circuit including a switch mechanism configured to connect the electrical test circuit to the plurality of electrical probes at a first switch setting or connect the electrical test circuit to the plurality of test contacts at a second switch setting; and at least one shock mitigation structure coupled to the plurality of electrical probes or the plug test connection arrangement, the at least one shock mitigation structure being configured to prevent user access to the plurality of electrical probes or the plug test connection arrangement.

2. The device of claim 1, wherein the plurality of electrical probes include a hot blade structure, a neutral blade structure and a ground prong configured for an outlet receptacle.

3. The device of claim 1, wherein at least the electrical test circuit is disposed within a hand-held device housing.

4. The device of claim 1, wherein the electrical test circuit includes a display.

5. The device of claim 4, wherein the display includes a plurality of discrete indicators.

6. The device of claim 4, wherein the display includes a two-dimensional display device configured to display alphanumeric indicia representative of the at least one electrical test.

7. The device of claim 1, wherein the at least one shock mitigation structure includes a user-actuatable retraction mechanism configured to retract the plurality of electrical probes or the plurality of test contacts.

8. The device of claim 1, wherein the at least one shock mitigation structure includes a retractable mechanism configured to retract the plurality of electrical probes at the second switch setting and retract the plurality of test contacts at the first switch setting switch setting.

9. The device of claim 1, wherein the at least one shock mitigation structure includes at least one retaining wall extending from a major rear surface of a device body around at least a portion of a perimeter of the plug test connection arrangement and the plurality of test contacts.

10. The system of claim 9, wherein the at least one retaining wall encloses a portion of the plug connector when the plug connector is inserted within the plug test connection arrangement.

11. The device of claim 1, wherein the at least one shock mitigation structure includes a receptacle structure formed within a device body enclosing the at least one electrical test circuit, the receptacle including the plurality of test contacts disposed therein in a recessed manner.

12. The device of claim 1, wherein the at least one shock mitigation structure includes a shroud structure disposed around the plurality of test contacts or the plurality of electrical probes.

13. The device of claim 1, wherein the at least one shock mitigation structure includes a removable cap structure configured to be disposed over the plurality of electrical probes when the plurality electrical probes are not in use.

14. The device of claim 1, wherein the plug test connection arrangement is configured as a receptacle structure formed in a major surface of the electrical testing device.

15. The device of claim 1, wherein the plug test connection arrangement is disposed in a region of a major surface of the electrical testing device.

16. The device of claim 15, further comprising a retaining wall and a latch mechanism disposed around a perimeter portion of the region.

17. The device of claim 15, wherein the plurality of test contacts include a plurality of conductive posts structures extending from the major surface within the region.

18. The device of claim 1, further comprising:

a housing;

a retractable slide mechanism disposed in the housing, the retractable slide mechanism including the plurality of electrical probes at a first end thereof and the plurality of test contacts at a second end thereof, in the first switch setting the plurality of electrical probes are exposed and accessible at the first end and the plurality of test contacts are recessed within the second end, in a second switch setting the plurality of test contacts are exposed and accessible at the second end and the plurality of electrical probes are recessed within the first end, the switch mechanism being configured to move between the first switch setting and the second switch setting.

19. The device of claim 18, wherein the switch mechanism is a three-way switch having a third switch setting disposed between the first switch setting and the second switch setting, the third switch setting disconnecting the electrical test circuit from both the plurality of test contacts and the plurality of electrical probes.

20. The device of claim 1, wherein the at least one electrical test is selected from a group of electrical tests that include a continuity test, a polarity test, an over-voltage test, an under-voltage test, and a simulation test configured to determine whether the AC circuit-under-test is protected by a protective wiring device.

21. The device of claim 20, wherein the simulation test introduces a simulated ground fault to determine whether the AC circuit-under-test is protected by a GFCI.

22. The device of claim 20, wherein the simulation test introduces a simulated arc fault to determine whether the AC circuit-under-test is protected by an AFCI.

23. An electrical testing device for use in an AC electrical power distribution circuit including a plurality of AC electric power transmitting wires coupled between an AC power distribution point and a device box, the device comprising:

a plug test connection arrangement configured to receive a plug connector when inserted therein, the plug connector including a plurality of plug contacts and a termination arrangement configured to terminate the plurality of AC electric power transmitting wires such that electrical continuity is established between the AC power distribution point and the plurality of plug contacts, the plug connector being configured to mate within a rear portion of an electrical wiring device via a latching connection to establish electrical continuity between the electrical wiring device and the plurality of AC electric power transmitting wires, the plug test connection arrangement including a plurality of test contacts configured to mate with the plurality of plug contacts when the plug connector is inserted into the plug test connection arrangement, the termination arrangement being in a detached relationship from the device box after the plurality of AC electric power transmitting wires are terminated;

an electrical test circuit configured to perform at least one electrical test to determine whether the plurality of AC electric power transmitting wires, the plurality of plug contacts or the termination arrangement are correctly interconnected;

a display coupled to the electrical test circuit, the display being configured to generate a user-perceivable signal relating to the at least one electrical test; and at least one shock mitigation structure coupled to the plug test connection arrangement, the at least one shock mitigation structure being configured to prevent user access to the plurality of test contacts when the plug connector is mated with the plug test connection arrangement.

24. The device of claim 23, wherein the plug test connection arrangement is not configured to latch the plug connector within the plug test connection arrangement when the plug connector is mated to the plug test connection arrangement.

25. The device of claim 23, wherein the plug test connection arrangement is configured to latch the plug connector within the plug test connection arrangement when the plug connector is mated to the plug test connection arrangement.

26. The device of claim 23, wherein the plug tester includes a single pole switch disposed therein, and the at least one electrical test includes closing the single pole switch such that a load disposed in the AC electrical distribution circuit is energized.

27. The device of claim 23, wherein the electrical test circuit includes circuit segment having a user accessible switch in series with a resistor, the circuit segment being disposed across two of the plurality of test contacts.

28. The device of claim 23, wherein at least the electrical test circuit is disposed within a hand-held device housing.

29. The device of claim 23, further comprising a plurality of electrical probes configured for insertion into an outlet receptacle.

30. The device of claim 29, wherein the electrical test circuit includes a switch mechanism configured to connect the electrical test circuit to the plurality of electrical probes at a first switch setting or connect the electrical test circuit to the plurality of test contacts at a second switch setting.

31. The device of claim 30, wherein the plurality of electrical probes and the plug test connection arrangement are disposed at a first end of the device, and the display and switch mechanism are disposed at a second end of the device.

32. The device of claim 31, further comprising a shroud structure disposed around the plurality of test contacts or the plurality of electrical probes.

33. The device of claim 30, further comprising:

a housing;

a retractable slide mechanism disposed in the housing, the retractable slide mechanism including the plurality of electrical probes at a first end thereof and the plurality of test contacts at a second end thereof, in the first switch setting the plurality of electrical probes are exposed and accessible at the first end and the plurality of test contacts are recessed within the second end, in a second switch setting the plurality of test contacts are exposed and accessible at the second end and the plurality of electrical probes are recessed within the first end, the switch mechanism being configured to move between the first switch setting and the second switch setting.

34. The device of claim 30, wherein the switch mechanism is a three-way switch having a third switch setting disposed between the first switch setting and the second switch setting, the third switch setting disconnecting the electrical test circuit from both the plurality of test contacts and the plurality of electrical probes.

35. The device of claim 23, wherein the at least one shock mitigation structure includes a user-actuatable retraction mechanism configured to retract the plurality of electrical probes or the plurality of test contacts.

36. The device of claim 29, wherein the at least one shock mitigation structure includes a removable cap structure configured to be disposed over the plurality of electrical probes when the plurality electrical probes are not in use.

37. The device of claim 23, wherein the plug test connection arrangement is configured as a receptacle structure formed in a major surface of the electrical testing device.

38. The device of claim 23, wherein the plug test connection arrangement is disposed in a region of a major surface of the electrical testing device.

39. The device of claim 38, further comprising a retaining wall and a latch mechanism disposed around a perimeter portion of the region.

40. The device of claim 38, wherein the plurality of test contacts include a plurality of conductive posts structures extending from the major surface within the region.

41. The device of claim 23, wherein the display includes a plurality of discrete indicators.

42. The device of claim 23, wherein the display includes a two-dimensional display device configured to display alphanumeric indicia representative of the at least one electrical test.

43. The device of claim 23, wherein the at least one electrical test circuit selectively provides the display with at least one of a plurality of uniquely coded user-perceivable signals at a given time, each of the plurality of uniquely coded user-perceivable signals representing a corresponding one of a plurality of improper wiring conditions in the plurality of AC electric power transmitting wires, the plurality of plug contacts or the termination arrangement.

44. The device of claim 23, wherein the at least one electrical test is selected from a group of electrical tests that include a continuity test, a polarity test, an over-voltage test, an under-voltage test, and a simulated test configured to determine whether the AC circuit-under-test is protected by a protective wiring device.

45. The device of claim 44, wherein the simulated test introduces a simulated ground fault to determine whether the AC circuit-under-test is protected by a GFCI.

46. The device of claim 45, wherein the AC power distribution circuit includes a hot conductor, a neutral conductor, and a ground conductor, the electrical circuit including a resistive element and a user accessible switch coupled to the hot and neutral conductors in series, an electrical current flowing through the resistive element in response to activation of the user accessible switch.

47. The device of claim 44, wherein the simulated test introduces a simulated arc fault to determine whether the AC circuit-under-test is protected by an AFCI.

48. The device of claim 23, wherein the plug connector is retained within the plug test connection arrangement by friction fit when mated.

49. The device of claim 23, further comprising an audible indicator.

50. An electrical testing device for use in an AC electrical power distribution circuit including a plurality of AC electric power transmitting wires coupled between an AC power distribution point and a device box, the device comprising:

a plug test connection arrangement configured to receive at least one plug connector when inserted therein, the at least one plug connector including a plurality of plug contacts and a termination arrangement configured to terminate the plurality of AC electric power transmitting wires such that electrical continuity is established between the AC power distribution point and the plurality of plug contacts, the plug test connection arrangement including a plurality of test contacts configured to mate with the plurality of plug contacts when the plug connector is inserted into the plug test connection arrangement, the termination arrangement being in a detached relationship from the device box after the plurality of AC electric power transmitting wires are terminated;

an electrical test circuit configured to perform at least one electrical test to determine whether the plurality of AC electric power transmitting wires, the plurality of plug contacts or the termination arrangement are properly interconnected, the electrical test circuit including a switch mechanism coupled to a battery, the switch mechanism being configured to couple the battery to the plurality of test contacts and perform the electrical continuity test when the AC electrical power distribution circuit is deenergized;

an indicator coupled to the electrical test circuit, the indicator being configured to generate a user-perceivable signal relating to the electrical continuity test; and at least one shock mitigation structure coupled to the plug test connection arrangement, the at least one shock mitigation structure being configured to prevent user access to the plug test connection arrangement in an energized state.

51. The device of claim 50, wherein the at least one electrical test is selected from a group of electrical tests that include a continuity test, a polarity test, an over-voltage test, an under-voltage test, and a simulation test configured to determine whether the AC circuit-under-test is protected by a protective wiring device.

52. The device of claim 51, wherein the simulation test introduces a simulated ground fault to determine whether the AC circuit-under-test is protected by a GFCI.

53. The device of claim 51, wherein the simulation test introduces a simulated arc fault to determine whether the AC circuit-under-test is protected by an AFCI.

54. The device of claim 50, wherein the at least one electrical test is performed when the AC electrical power distribution circuit is deenergized, the electrical test circuit introducing a test signal powered by the battery into the AC electrical power distribution circuit.

55. The device of claim 50, further comprising a plurality of electrical probes configured for insertion into an outlet receptacle.

56. The device of claim 55, wherein the switch mechanism configured to connect the electrical test circuit to the plurality of electrical probes at a first switch setting or connect the electrical test circuit to the plurality of test contacts at a second switch setting.

57. The device of claim 56, wherein the switch mechanism is a three-way switch having a third switch setting disposed between the first switch setting and the second switch setting, the third switch setting disconnecting the electrical test circuit from both the plurality of test contacts and the plurality of electrical probes.

58. The device of claim 56, wherein the switch mechanism is a four way switch.

59. An electrical testing device for use in an AC electrical power distribution circuit including a plurality of AC electric power transmitting wires coupled between an AC power source and a device box, the device comprising:

a modular test connection arrangement including a plurality of replaceable test connectors, the plurality of replaceable test connectors including a replaceable plug test connector arrangement configured to mate with a corresponding plug connector of a plurality of plug connectors, each plug connector of the plurality of plug connectors including a plurality of plug contacts and a termination arrangement configured to terminate the plurality of AC electric power transmitting wires such that electrical continuity is established between the AC power distribution point and the plurality of plug contacts, each replaceable plug test connector including a plurality of test contacts configured to mate with the plurality of plug contacts of the corresponding plug connector, the termination arrangement being in a detached relationship from the device box after the plurality of AC electric power transmitting wires are terminated;

an electrical test circuit configured to perform at least one electrical test to determine whether the plurality of AC electric power transmitting wires, the plurality of plug contacts or the termination arrangement are properly interconnected; and an indicator coupled to the electrical test circuit, the indicator being configured to generate a user-perceivable signal relating to the electrical continuity test.

60. The device of claim 59, wherein the replaceable plug test connector arrangement is configured as a receptacle structure formed in a major surface of the replaceable test connector.

61. The device of claim 59, wherein the replaceable plug test connector arrangement is disposed on a major surface of the replaceable test connector.

62. The device of claim 61, further comprising a retaining wall and a latch mechanism disposed around a perimeter portion of the replaceable plug test connector arrangement.

63. The device of claim 61, wherein the plurality of test contacts include a plurality of conductive posts structures extending from the major surface within the region.

64. The device of claim 59, wherein the plurality of replaceable test connectors further includes a second kind of replaceable test connector, the second kind of replaceable test connector including a plurality of electrical probes configured for insertion into an outlet receptacle.

65. The device of claim 64, wherein the plurality of electrical probes include a hot blade structure, a neutral blade structure and a ground prong configured for an outlet receptacle.

* * * * *

UNITED STATES PATENT AND TRADEMARK OFFICE

CERTIFICATE OF CORRECTION

PATENT NO. : 7,528,609 B2
APPLICATION NO. : 12/019326
DATED : May 5, 2009
INVENTOR(S) : Savicki et al.

It is certified that error appears in the above-identified patent and that said Letters Patent is hereby corrected as shown below:

Please correct the typographical error as follows:

Column 14, claim 8, line 22, reads “first switch setting switch setting.”

Please delete the second appearance of the term switch setting such that column 14, claim 18, line 22 reads:

--first switch setting.--

Signed and Sealed this

Thirtieth Day of June, 2009

JOHN DOLL

*Acting Director of the United States Patent and Trademark Office*